United States Patent [19]
Morton, Jr.

[11] 4,454,413
[45] Jun. 12, 1984

[54] APPARATUS FOR TRACKING INTEGRATED CIRCUIT DEVICES

[75] Inventor: William D. Morton, Jr., Santa Clara, Calif.

[73] Assignee: Precision Monolithics, Inc., Santa Clara, Calif.

[21] Appl. No.: 350,245

[22] Filed: Feb. 19, 1982

[51] Int. Cl.³ .............................................. G06F 17/00
[52] U.S. Cl. .................................. 235/375; 235/383; 235/456; 235/494
[58] Field of Search ............... 235/462, 458, 459, 460, 235/461, 463, 464, 442, 445, 435, 491, 469, 449, 454, 470, 375–385, 489; 250/548, 557, 568

[56] References Cited

U.S. PATENT DOCUMENTS

| | | | |
|---|---|---|---|
| 3,354,568 | 11/1967 | Koschier | 40/158 |
| 3,358,824 | 12/1967 | Stagnitto | 206/63.2 |
| 3,644,715 | 2/1972 | Holdrith | 235/442 |
| 3,831,006 | 8/1974 | Chaffin et al. | 235/375 |
| 3,916,157 | 10/1975 | Roulette et al. | 235/449 |
| 4,128,757 | 12/1978 | Garner, Jr. | 235/383 |
| 4,349,731 | 9/1982 | Berner | 235/489 |
| 4,365,148 | 12/1982 | Whitney | 235/383 |

Primary Examiner—Harold I. Pitts
Assistant Examiner—Robert Lev
Attorney, Agent, or Firm—William G. Becker; Richard S. Koppel; Michael D. Harris

[57] ABSTRACT

A plurality of carriers for integrated circuit devices are each uniquely coded so as to be recognizable by an automatic decoding apparatus. The devices are tested and the test results accurately correlated with the appropriate devices by recording the test results for each device, reading the identification code for each carrier in the same sequence in which the devices are tested, and then correlating the test results with the device identifications. A prior art requirement of maintaining the carriers in the order in which they were tested is eliminated once the carriers have been thus identified. In a preferred embodiment the carrier body is provided with an array of perforations, the transmission of light through each perforation being blocked by a breakable membrane. Each carrier is coded by breaking a selected combination of its membranes to establish a unique binary identification code for each carrier. The carriers are identified during or immediately after testing by illuminating one side of the perforation array and sensing the pattern of light emitted from the opposite side of the array. In another embodiment the carriers are uniquely identified by bar code displays which are scanned by a decoding device to enable correlation of the carriers with the test results for their respective integrated circuit devices.

6 Claims, 6 Drawing Figures

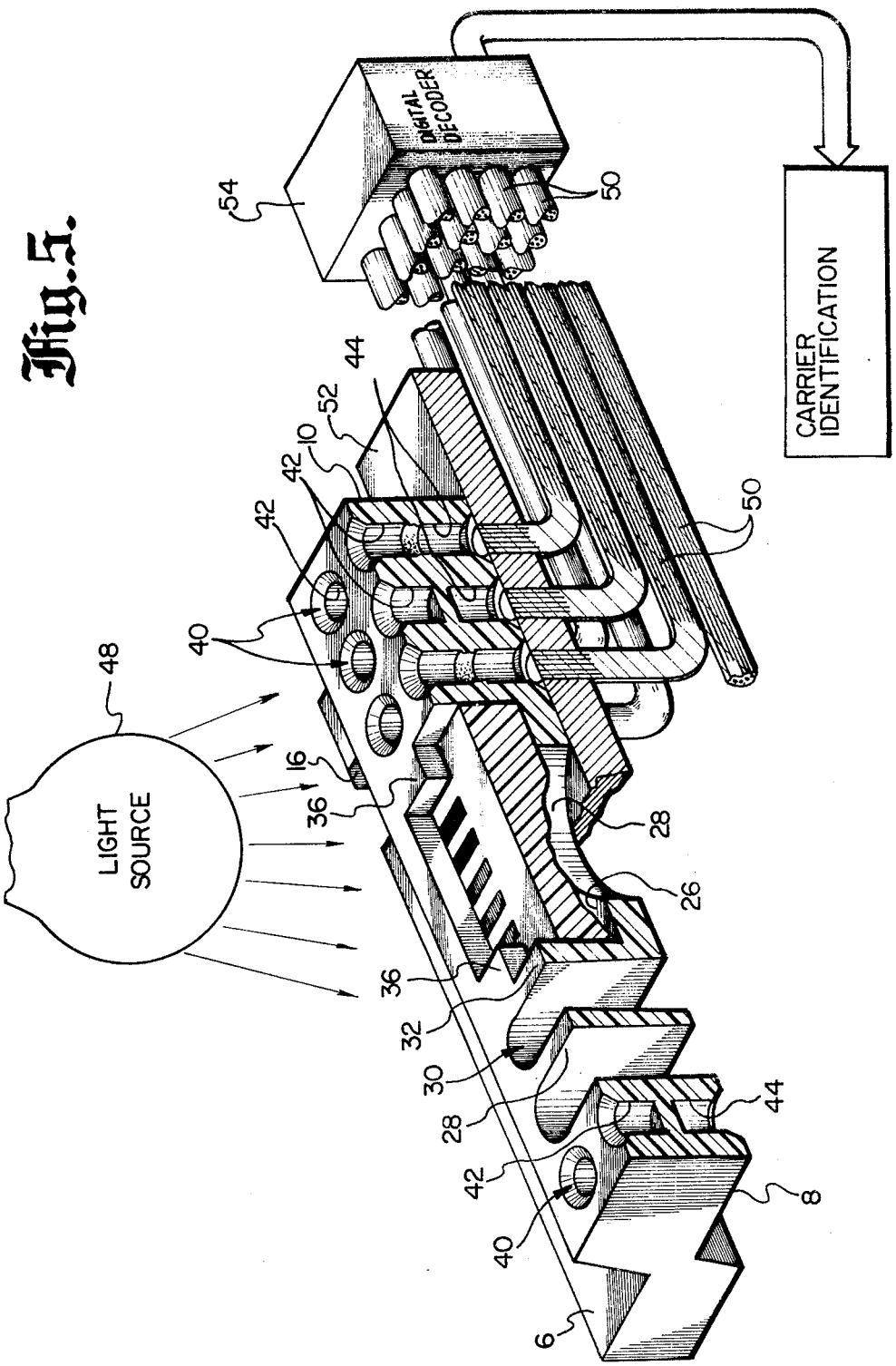

APPARATUS FOR TRACKING INTEGRATED CIRCUIT DEVICES

BACKGROUND OF THE INVENTION

1. Field of the Invention

This invention relates to the testing of integrated circuit devices, and more particularly to a method and apparatus for tracking a plurality of integrated circuit devices during testing so that the test results can be correlated with the correct devices.

2. Description of the Prior Art

Testing standards for integrated circuit devices vary depending upon the application intended for the sevice. Where a lower degree of reliability is required, it is often satisfactory to provide a batch of devices with only a certain percentage of the devices meeting predetermined specifications. In these situations testing can be performed on a statistical basis, without segregating the test results for each individual device, or test results provided statistically.

Where high reliability is desired, on the other hand, it may be necessary to test each device individually and to reject all devices not meeting the required specifications. With this type of testing it is extremely important to keep track of all the devices so that the test results can be correlated with the proper devices. Any mixup can result in unacceptable devices being left in, or acceptable devices being rejected. Complicating this requirement for accurate correlation is the fact that testing is performed most efficiently when a large number of devices are tested in succession and unacceptable parts are removed only after all of the devices have been tested, rather than stopping the testing process each time an unacceptable part is encountered.

The most commonly used method for high reliability testing of integrated circuit devices, referred to as data logging, involves testing the devices in sequence and recording the test results in the same sequence, lining up the devices after testing, and loading them into container tubes. In order to properly correlate the devices in the tubes with the test results it is necesary to maintain the sequential order of both the tubes and of all devices within each tube. With this method it is possible to throw off the results of an entire test sequence by placing a single device seriously out of sequence, or by arranging the tubes in the wrong order.

SUMMARY OF THE INVENTION

In view of the above problems associated with the prior art, it is an object of the present invention to provide novel and improved apparatus and a method for tracking a plurality of integrated circuit devices during testing so that the test results can be accurately matched with the individual devices with assurance.

Another object is the provision of novel and improved apparatus and a method for automatically tracking integrated circuit devices during a test sequence, without having to arrange the devices in any particular physical order or sequence.

These and other objects are realized in the present invention by providng a plurality of carriers, each of which is adapted to hold an integrated circuit device while the device is tested. Each of the carriers includes a coding means which is recognizable by an automatic decoding apparatus. Unique codes are assigned to each carrier, whereby the code can be automatically read and the carrier identified as the device is tested or immediately thereafter. The active identification of each carrier permits the test results to be reliably correlated with the individual devices tested.

In a preferred embodiment each of the carriers has an array of perforations which extend through its body, while a membrane blocks the passage of light through each perforation. A unique combination of perforations can be broken for each carrier, thereby establishing a unique identification code for each carrier that is detected by transmitting light through the broken perforations to an optical decoding device. The identity of all integrated circuit devices which do not meet the testing standards can thus be reliably determined by testing each device while in its respective carrier, recording the test results for each device, reading the identification code for each carrier in the same sequence that the test results are recorded, and correlating the test results with the carrier identifications to match each device with its respective results. Alternatively, an optical bar code display or other coding mechanism which is recognizable by an automatic decoding apparatus can be used to establish a unique identification code for each carrier.

These and other features and objects of the invention will be apparent to those skilled in the art from the following detailed description of preferred embodiments, taken together with the accompanying drawings, in which:

DESCRIPTION OF THE DRAWINGS

FIG. 5 is a cut-away perspective view illustrating apparatus used to identity the carrier of FIG. 1.

DETAILED DESCRIPTION OF PREFERRED EMBODIMENTS

Figure 1:
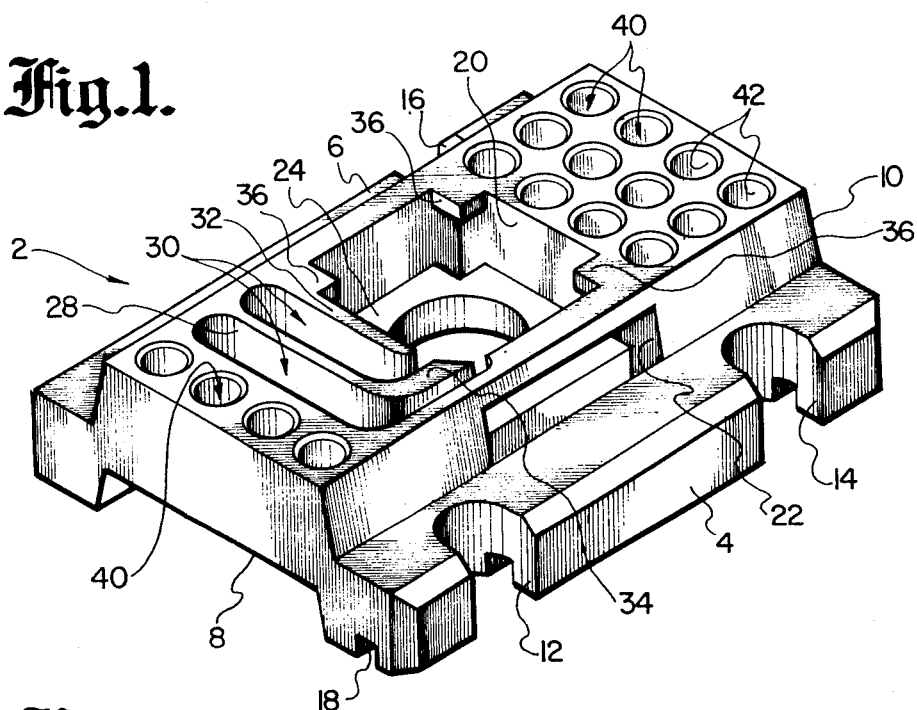
FIG. 1 is a perspective view of a carrier for an integrated circuit device constructed in accordance with the invention.

A carrier which may be used to hold an integrated circuit device for testing in accordance with the invention is shown in FIG. 1. The carrier consists of a body 2 having a standard exterior shape to facilitate automatic handling of the carrier and the integrated circuit device which it holds. The body has a wide base with two lateral wings 4 and 6, a central channel 8 running the length of the carrier along its underside, and a raised central portion 10 for receiving an integrated circuit chip. A pair of vertical slots 12 and 14 are cut through wing 4, and a single vertical slot 16 is cut through wing 6 to permit automatic alignment of the carrier in environmental handling machines; the size and positions of the slots and of wings 4 and 6 are industry standards. A groove 18 cut into the underside of wing 4 enables the carrier to be aligned on a track in a bowl feed apparatus.

The carrier shown in FIG. 1 is designed to be used for a leadless integrated circuit chip. However, the present invention is applicable to carriers for many different kinds of integrated circuit devices, and the depiction of the leadless chip carrier is for purposes of illustration only. Extending inwardly from the upper central surface of the carrier body shown in FIG. 1 is a cavity 20, the lateral dimensions of which are slightly larger than a standard leadless integrated circuit chip which the carrier is designed to hold. A generally rectangular opening 22 extends through one of the side walls of the carrier body bounding cavity 20 to provide lateral access to the cavity. Opening 22 permits the insertion of a standard leadless chip into the cavity, which has a floor 24 at its lower end to support the chip. A circular opening 26 is centrally located in the floor to assist in equalizing the temperature at the upper and lower surfaces of the chip.

Figure 2:
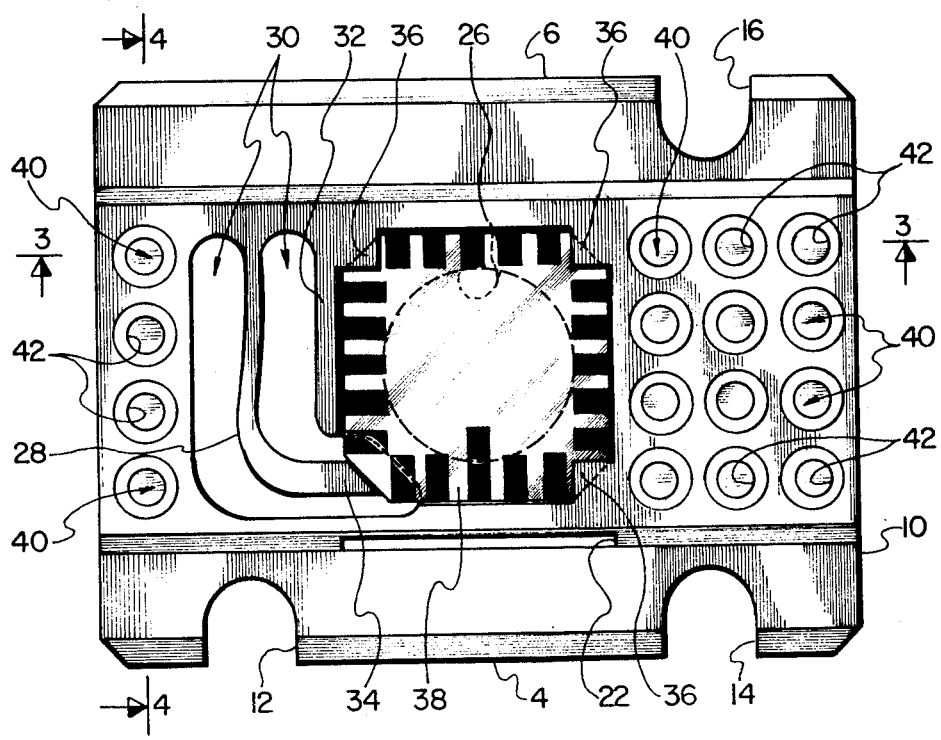
FIG. 2 is a plan view of the carrier shown in FIG. 1 holding an integrated circuit chip.
Figure 3:
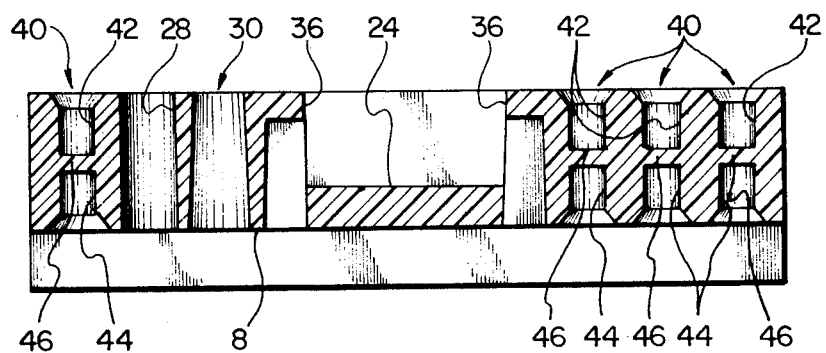
FIGS. 3 and 4 are respectively views taken along the lines 3—3 and 4—4 of FIG. 2 with the chip removed.
Figure 4:
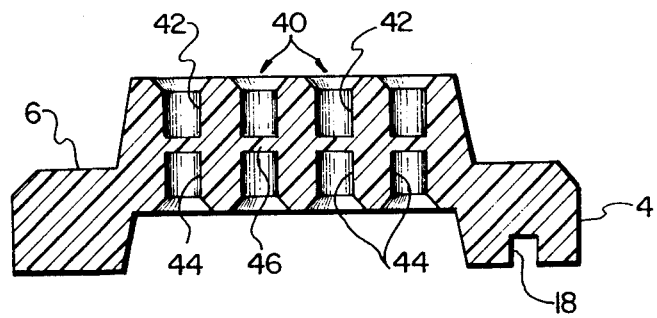

A generally L-shaped, stiffly flexible cantilevered arm 28 formed integrally with the carrier body extends through a recess 30 which is separated from the cavity by a thin wall 32. Arm 28 terminates in a head 34 which protrudes into cavity 20 through a gap between wall 32 and the carrier wall in which opening 22 is formed. Arm 28 is positioned so that it must be flexed away from the cavity when a chip is inserted, its head 34 thereafter bearing against the chip under the internal spring bias of the flexed arm to hold the chip in place within the cavity. A series of tabs 36 project into the cavity from three of its upper corners to hold the chip down. A leadless integrated circuit chip 38 is shown in place within the carrier in FIG. 2. Further details of the mechanism for retaining a leadless chip within the carrier are disclosed in my co-pending patent application Ser. No. 350,246, filed on the same date at the present application.

The carrier has a special coding mechanism enabling it to be uniquely coded so that it can be tracked and accurately identified during testing of a chip held in the carrier. This is important when a large number of chips are tested at once, because without proper identification it is possible to mix up the chips and assign the various results to the wrong chips. The coding apparatus employed in this embodiment is shown in FIGS. 1-4. It consists of an array of perforations 40 which extend vertically through the central portion 10 of the carrier. Each perforation consists of a first opening 42 extending down from the upper surface of the carrier, a second opening 44 extending upward in axial alignment with opening 42 from the underside of the carrier, and a thin membrane 46 which extends across the perforation to separate the two openings. Membranes 46 may be provided as separate elements, but preferably are formed integrally with the body of the carrier in a molding operation. The carrier is formed from a suitable rubber, plastic or similar material which is capable of withstanding the environmental conditions to which a chip is subjected during testing, but which permits membranes 46 to be broken as described hereinafter.

The carrier illustrated in the drawings has four rows of perforations, three on one side of the cavity and one on the opposite side, with four perforations to each row. Other arrays can also be employed with different numbers and positions of perforations, but the illustrated arrangement is a convenient one for sensing the coding applied to each carrier.

Each of a series of carriers is uniquely coded by breaking a combination of membranes which is unique to each carrier. For example, of the membranes are numbered in order, one carrier may be coded by breaking only the first membrane, the second by breaking only the second membrane, the third by breaking the first and second membranes, the fourth by breaking only the third membrane, etc. The coding technique thus lends itself very conveniently to a binary coding system, with each separate carrier assigned a unique binary code as determined by the combination of perforations with broken membranes.

The carriers can be positively identified at any convenient point in a testing or processing sequence by illuminating one side of the array of perforations and detecting light which is transmitted through those perforations with broken membranes. Since the intact membranes block the transmission of light through their respective perforations, the pattern of light emitted from the array of perforations can be used to identify the carrier. In practice, each of a set of carriers is assigned a unique code by piercing a unique combination of membranes for that carrier with a punch or other suitable instrument. An integrated circuit device is then loaded into each carrier, and the carriers are moved sequentially through a test system. The test results for each integrated circuit device are recorded as the device is tested, and the carriers are then automatically identified while in the same sequence. Carrier identification can be accomplished either after or simultaneously with testing. The test results can thus be reliably correlated with the identity of the individual carriers and the integrated circuit devices they hold. Even if the carriers are later mixed up, a positive identification of any particular circuit device can be established merely by reading its carrier's identification code. The identification of those circuit devices to be rejected and those which have passed the test can thus be made with confidence even if the carriers are not maintained in their original order FIG. 5 illustrates a system which can be used to read the carrier identification codes. A light source 48 is positioned over the carrier and illuminates each of the perforations in the array. A bundle of optical fibers 50 are held in openings of a plate 52 in respective alignment with each of the perforations. The ends of the fibers extend to a point immediately adjacent the underside of the carrier, and are lapped smooth so that each fiber detects light transmitted only through its respective perforation. Light transmitted from the perforations to the fibers is guided by the fibers to a decoder 54, which provides a carrier identification as determined by the combination of fibers transmitting light. Numerous types of suitable fibers and decoders are available; when the carriers are digitally coded a digital decoder would be employed.

Figure 6:
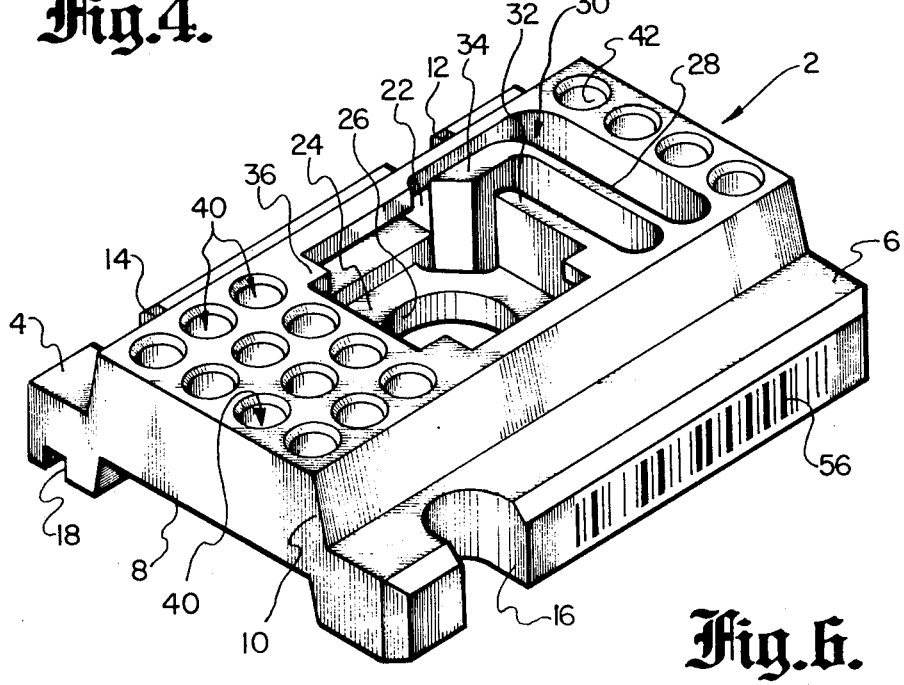
FIG. 6 is a perspective view of a carrier for an integrated circuit device employed in another embodiment of the invention.

Another embodiment of the invention is shown in FIG. 6. In this embodiment a carrier identical to that previously described is employed, but instead of perforations 40 a bar coded pattern 56 is displayed on the outer shoulder of carrier wing 6. Each carrier is provided with a unique bar code, enabling the various carriers to be identified by scanning the bar code area with an optical readout device. Standard bar codes may be employed, so long as each carrier receives its own code. The bar codes may be burned into the carrier with a laser, displayed on a sticker which is adhered to the carrier, or by any other convenient means. Application of the codes by a laser burn can be controlled by means of a computer operated, articulating mask which forms a separate code for each successive carrier, or a collection of different masks having different code patterns for each carrier could be used. The bar coding technique is very adaptable to the automatic identification of individual carriers, and again makes it possible to track and positively identify the various carriers during and after testing even if they get out of their original sequential order.

While various embodiments of the invention have been shown and described, it should be understood that other modifications and alternate embodiments will occur to those skilled in the art. For example, the carriers could be coded by placing various patterns of dots of magnetic material on their respective surfaces, and magnetic sensing heads employed to determine the dot patterns and thereby identify each carrier. Also, the orientation of the perforations could be altered and the perforations centered on curved or bent axes. Accordingly, it is intended that the invention be limited only in terms of the appended claims:

I claim:

1. A carrier for retaining and uniquely identifying an integrated circuit chip, comprising:
   a carrier body formed from a stiffly flexible material,
   a cavity formed within the carrier body for seating the chip with the chip accessible for testing,
   resilient retainer means formed integrally with the carrier body and normally blocking access by the chip to the cavity, said retainer means being flexible to a position permitting the chip to be loaded into the cavity, and when released bearing against the chip to retain it within the cavity,
   a first array of identification openings extending directly into the carrier body from one side thereof adjacent the cavity,
   a second array of identification openings extending directly into the carrier body from the opposite side thereof, each of the openings in the second array being aligned with a respective opening in the first array and separated therefrom by a membrane porton of the carrier body,
   each of said membranes being breakable to enable the transmission of light between its respective identification openings, whereby the carrier may be provided with a unique identification code by breaking a unique combination of membranes to provide a coded array of light transmission paths through the carrier body.

2. The integrated circuit chip carrier of claim 1, the carrier having top, bottom and side surfaces, wherein an access opening is provided in the side of the carrier body for loading a chip into the cavity through the access opening, and the first and second arrays of identification openings respectively extend into the top and bottom of the carrier body and are laterally offset from the access opening.

3. A carrier for retaining and uniquely identifying an integrated circuit chip, comprising:
   a carrier body formed from a stiffly flexible material,
   a cavity formed within the carrier body for seating the chip with the chip accessible for testing,
   resilient retainer means formed integrally with the carrier body and normally blocking access by the chip to the cavity, said retainer means being flexible to a position permitting the chip to be loaded into the cavity, and when released bearing against the chip to retain it within the cavity,
   an array of identification openings extending directly into the carrier body from one side thereof adjacent the cavity,
   a plurality of breakable membranes formed integrally with the carrier body, each of said membranes separating a respective identification opening from the side of the carrier body opposite said one side,
   each of said membranes being breakable to enable the transmission of light through the carrier body, whereby the carrier may be provided with a unique identification code by breaking a unique combination of membranes to provide a coded array of light transmission paths through the carrier body.

4. The integrated circuit chip carrier of claim 3, the carrier having top, bottom and side surfaces, wherein an access opening is provided in the side of the carrier body for loading a chip into the cavity through the access opening, and said identification openings extend between the top and bottom of the carrier body and are laterally offset from the access opening.

5. Apparatus for tracking a plurality of integrated circuit chips, comprising:
   a plurality of integrated circuit chip carriers, each carrier comprising a body formed from a stiffly flexible material, a cavity formed within the body for seating an integrated circuit chip, and resilient retainer means formed integrally with the carrier body and normally blocking access by a chip to the cavity, said retainer means being flexible to a position permitting the chip to be loaded into the cavity, and when released bearing against the chip to retain it within the cavity,
   each of said carriers including an array of light transmissive identification openings which extend directly through its body adjacent the chip cavity and are located within a coding area which is common to each carrier, the combination of the number and position of the identification openings for each carrier being unique to said carrier to establish a unique identification code therefor, whereby each carrier produces a unique identifiable light pattern when light is transmitted through its openings.

6. The apparatus of claim 5, said carriers having top, bottom and side surfaces, wherein an access opening is provided in the side of each carrier body for loading a chip into the cavity through the access opening, said array of light transmissive openings extending between the top and bottom surfaces of each carrier and laterally offset from the access opening.

* * * * *

UNITED STATES PATENT AND TRADEMARK OFFICE
CERTIFICATE OF CORRECTION

PATENT NO. : 4,454,413
DATED : June 12, 1984
INVENTOR(S) : William D. Morton, Jr.

It is certified that error appears in the above-identified patent and that said Letters Patent is hereby corrected as shown below:

The term of this patent subsequent to April 24, 2001, has been disclaimed.

Signed and Sealed this

Eighteenth Day of September 1984

[SEAL]

Attest:

GERALD J. MOSSINGHOFF

Attesting Officer

Commissioner of Patents and Trademarks

UNITED STATES PATENT AND TRADEMARK OFFICE
CERTIFICATE OF CORRECTION

PATENT NO.   : 4,454,413
DATED        : June 12, 1984
INVENTOR(S)  : William D. Morton, Jr.

It is certified that error appears in the above-identified patent and that said Letters Patent are hereby corrected as shown below:

Title page, Item /73/ should read:

--Bourns, Inc., Riverside, Ca.--.

Signed and Sealed this

Twenty-seventh Day of November 1984

[SEAL]

Attest:

Attesting Officer

GERALD J. MOSSINGHOFF

Commissioner of Patents and Trademarks